US012235096B2

(12) United States Patent
Pellemans et al.

(10) Patent No.: US 12,235,096 B2
(45) Date of Patent: *Feb. 25, 2025

(54) INSPECTION METHOD AND APPARATUS, LITHOGRAPHIC APPARATUS, LITHOGRAPHIC PROCESSING CELL AND DEVICE MANUFACTURING METHOD

(71) Applicant: ASML Netherlands B.V., Veldhoven (NL)

(72) Inventors: Henricus Petrus Maria Pellemans, Veldhoven (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/486,811

(22) Filed: Oct. 13, 2023

(65) Prior Publication Data
US 2024/0044639 A1 Feb. 8, 2024

Related U.S. Application Data

(60) Continuation of application No. 17/692,974, filed on Mar. 11, 2022, now Pat. No. 11,828,585, which is a
(Continued)

(51) Int. Cl.
*G01B 11/24* (2006.01)
*G03F 7/00* (2006.01)

(52) U.S. Cl.
CPC .......... *G01B 11/24* (2013.01); *G03F 7/70191* (2013.01); *G03F 7/70633* (2013.01); *G03F 7/7085* (2013.01)

(58) Field of Classification Search
CPC .............. G01B 11/24; G03F 7/70191; G03F 7/70633; G03F 7/7085
See application file for complete search history.

(56) References Cited

U.S. PATENT DOCUMENTS

| 4,408,884 A | 10/1983 | Kleinknecht et al. |
| 5,412,473 A | 5/1995 | Rosencwaig et al. |

(Continued)

FOREIGN PATENT DOCUMENTS

| EP | 0 818 814 A2 | 1/1998 |
| EP | 1 628 164 A2 | 2/2006 |

OTHER PUBLICATIONS

International Search Report directed to related International Application No. PCT/EP2009/001141, mailed Aug. 14, 2009; 4 pages.
(Continued)

*Primary Examiner* — Hung V Nguyen
(74) *Attorney, Agent, or Firm* — Sterne, Kessler, Goldstein & Fox P.L.L.C.

(57) ABSTRACT

A scatterometer for measuring a property of a target on a substrate includes a radiation source, a detector, and a processor. The radiation source produces a radiated spot on the target. The scatterometer adjusts a position of the radiated spot along a first direction across the target and along a second direction that is at an angle with respect to the first direction. The detector receives radiation scattered by the target. The received radiation is associated with positions of the radiated spot on the target along at least the first direction. The detector generates measurement signals based on the positions of the radiated spot on the target. The processor outputs, based on the measurement signals, a single value that is representative of the property of the target. The processor also combines the measurement signals to output a combined signal and derives, based on the combined signal, the single value.

18 Claims, 5 Drawing Sheets

Related U.S. Application Data continuation of application No. 16/817,552, filed on Mar. 12, 2020, now Pat. No. 11,307,024, which is a continuation of application No. 16/168,355, filed on Oct. 23, 2018, now Pat. No. 10,591,283, which is a continuation of application No. 15/913,253, filed on Mar. 6, 2018, now Pat. No. 10,209,061, which is a division of application No. 14/536,979, filed on Nov. 10, 2014, now Pat. No. 9,933,250, which is a continuation of application No. 12/867,416, filed as application No. PCT/EP2009/001141 on Feb. 18, 2009, now Pat. No. 8,885,150.

(60) Provisional application No. 61/064,312, filed on Feb. 27, 2008.

(56) References Cited

U.S. PATENT DOCUMENTS

| | | | |
|---|---|---|---|
| 5,576,659 | A | 11/1996 | Kenington et al. |
| 6,023,338 | A | 2/2000 | Bareket |
| 6,281,027 | B1 | 8/2001 | Wei et al. |
| 6,429,943 | B1 | 8/2002 | Opsal et al. |
| 7,329,888 | B2 | 2/2008 | Van Bilsen et al. |
| 7,360,703 | B2 | 4/2008 | McIntyre et al. |
| 7,791,727 | B2 | 9/2010 | Den Boef et al. |
| 7,791,732 | B2 | 9/2010 | Den Boef et al. |
| 8,111,398 | B2 | 2/2012 | Van der Schaar et al. |
| 8,885,150 | B2 | 11/2014 | Pellemans et al. |
| 9,933,250 | B2 | 4/2018 | Pellemans et al. |
| 10,209,061 | B2 | 2/2019 | Pellemans et al. |
| 10,591,283 | B2 | 3/2020 | Pellemans et al. |
| 11,307,024 | B2 | 4/2022 | Pellemans et al. |
| 11,828,585 | B2 * | 11/2023 | Pellemans ........... G03F 7/70191 |
| 2002/0135783 | A1 | 9/2002 | Opsal et al. |
| 2003/0214654 | A1 | 11/2003 | Wei et al. |
| 2004/0004726 | A1 | 1/2004 | Sezginer et al. |
| 2004/0136003 | A1 | 7/2004 | Smith |
| 2005/0206868 | A1 | 9/2005 | Kruijswijk et al. |
| 2006/0033921 | A1 | 2/2006 | Den Boef et al. |
| 2006/0060651 | A1 | 3/2006 | McIntyre et al. |
| 2006/0066855 | A1 | 3/2006 | Boef et al. |
| 2006/0126046 | A1 | 6/2006 | Hansen |
| 2006/0138366 | A1 | 6/2006 | Lakkapragada et al. |
| 2006/0138602 | A1 | 6/2006 | Mulkens et al. |
| 2006/0187468 | A1 | 8/2006 | Bischoff et al. |
| 2008/0043239 | A1 | 2/2008 | Boef et al. |
| 2008/0068609 | A1 | 3/2008 | Werkman et al. |
| 2008/0144036 | A1 | 6/2008 | Schaar et al. |
| 2008/0266560 | A1 | 10/2008 | Kok |
| 2008/0311344 | A1 | 12/2008 | Marie Kiers et al. |
| 2009/0109412 | A1 | 4/2009 | Sewell et al. |
| 2010/0134769 | A1 | 6/2010 | Mulkens et al. |
| 2011/0007314 | A1 | 1/2011 | Den Boef et al. |
| 2011/0043778 | A1 | 2/2011 | Tinnemans et al. |
| 2011/0128512 | A1 | 6/2011 | Pellemans et al. |
| 2011/0128520 | A1 | 6/2011 | Van Bilsen et al. |
| 2015/0131076 | A1 | 5/2015 | Pellemans et al. |
| 2018/0195857 | A1 | 7/2018 | Pellemans et al. |
| 2019/0056216 | A1 | 2/2019 | Pellemans et al. |
| 2020/0217648 | A1 | 7/2020 | Pellemans et al. |
| 2022/0196393 | A1 | 6/2022 | Pellemans et al. |

OTHER PUBLICATIONS

International Preliminary Report on Patentability and Written Opinion of the International Searching Authority directed to related International Patent Application No. PCT/EP2009/001141, issued Aug. 31, 2010; 9 pages.

Jakatdar, N., et al., "In-situ Metrology for Deep Ultraviolet Lithography Process Control," Proceedings of SPIE: Metrology, Inspection, and Process Control for Microlithography XII, vol. 3332, 1998; pp. 262-270.

Niu, X., et al., "Specular Spectroscopic Scatterometry in DUV Lithography," Proceedings of SPIE: Metrology, Inspection, and Process Control for Microlithography XIII, vol. 3677, 1999; pp. 159-168.

Non-Final Rejection mailed Jul. 3, 2013 for U.S. Appl. No. 12/867,416, filed Feb. 18, 2011; 12 pages.

Final Rejection mailed Jan. 15, 2014 for U.S. Appl. No. 12/867,416, filed Feb. 18, 2011; 10 pages.

Notice of Allowance mailed Jul. 10, 2014 for U.S. Appl. No. 12/867,416, filed Feb. 18, 2011; 5 pages.

Non-Final Rejection mailed Dec. 8, 2016 for U.S. Appl. No. 14/536,979, filed Nov. 10, 2014; 11 pages.

Non-Final Rejection mailed Jul. 17, 2017 for U.S. Appl. No. 14/536,979, filed Nov. 10, 2014; 10 pages.

Notice of Allowance mailed Nov. 27, 2017 for U.S. Appl. No. 14/536,979, filed Nov. 10, 2014; 9 pages.

Non-Final Rejection mailed May 11, 2018 for U.S. Appl. No. 15/913,253, filed Mar. 6, 2018; 5 pages.

Notice of Allowance mailed Sep. 24, 2018 for U.S. Appl. No. 15/913,253, filed Mar. 6, 2018; 7 pages.

Non-Final Rejection mailed Jul. 22, 2019 for U.S. Appl. No. 16/168,355, filed Oct. 23, 2018; 7 pages.

Notice of Allowance mailed Nov. 4, 2019 for U.S. Appl. No. 16/168,355, filed Oct. 23, 2018; 7 pages.

Non-Final Rejection mailed Sep. 8, 2021 for U.S. Appl. No. 16/817,522, filed Mar. 12, 2020; 7 pages.

Notice of Allowance mailed Dec. 12, 2021 for U.S. Appl. No. 16/817,522, filed Mar. 12, 2020; 5 pages.

Non-Final Rejection mailed Mar. 31, 2023 for U.S. Appl. No. 17/692,974, filed Mar. 11, 2022; 7 pages.

Notice of Allowance mailed Jul. 13, 2023 for U.S. Appl. No. 17/692,974, filed Mar. 11, 2022; 5 pages.

* cited by examiner

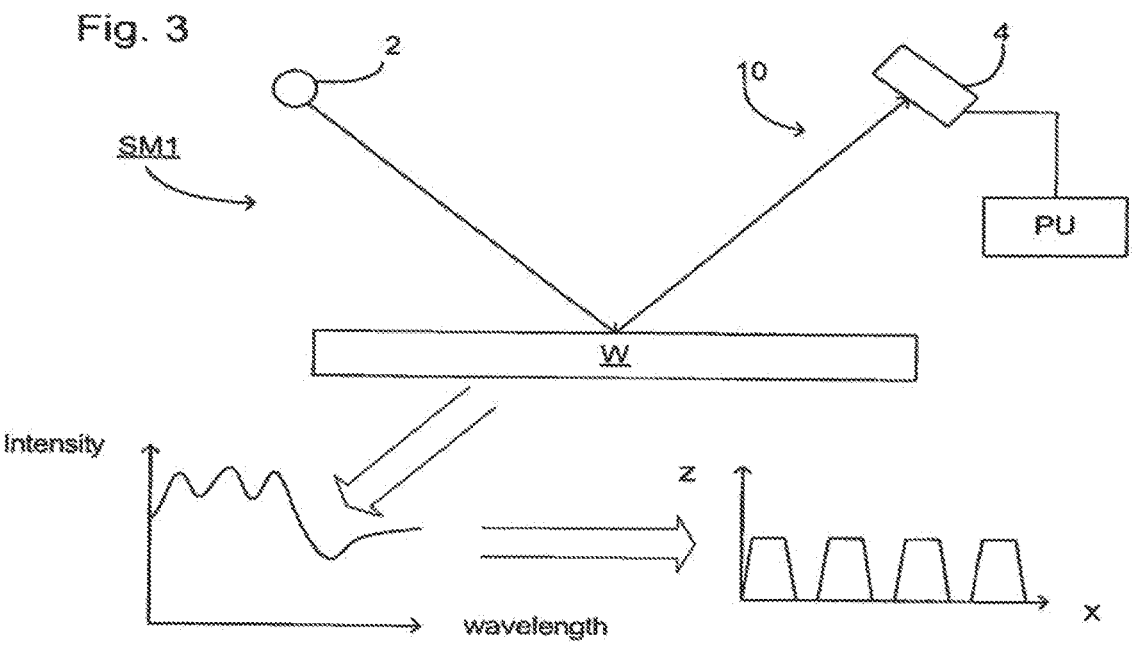
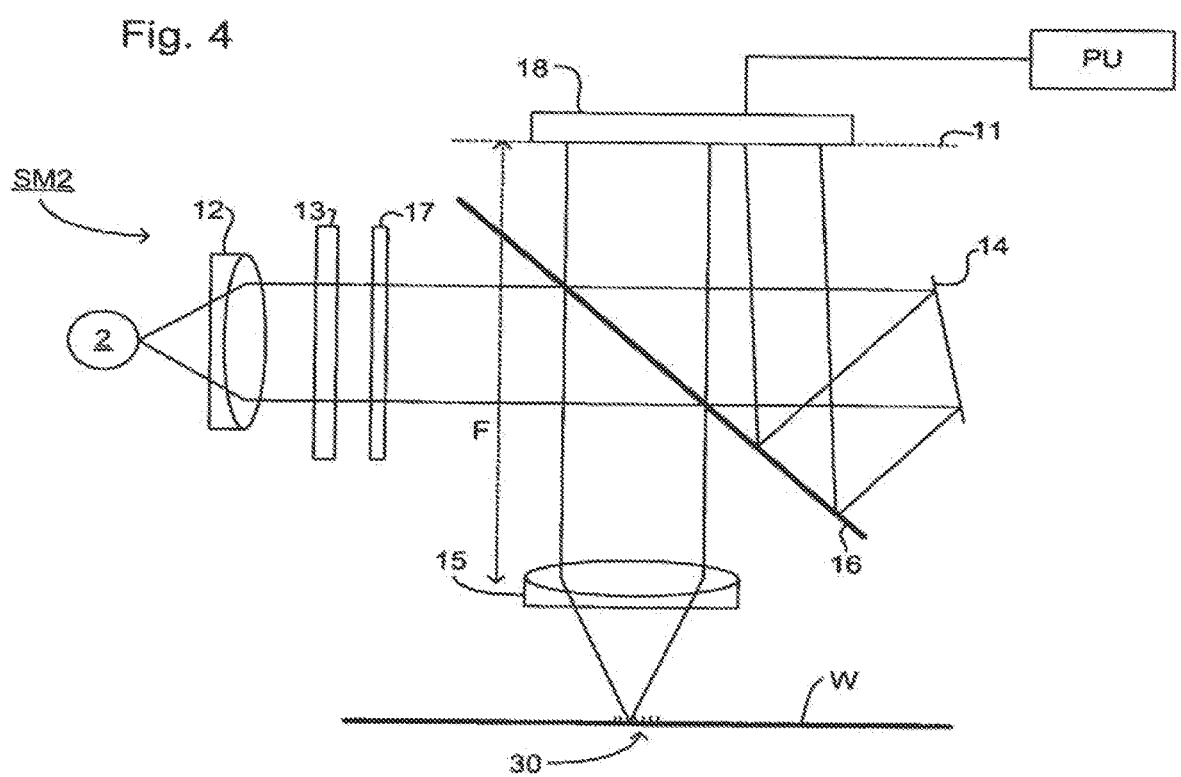

INSPECTION METHOD AND APPARATUS, LITHOGRAPHIC APPARATUS, LITHOGRAPHIC PROCESSING CELL AND DEVICE MANUFACTURING METHOD

CROSS REFERENCE TO RELATED APPLICATIONS

This application is a continuation of U.S. patent application Ser. No. 17/692,974 filed on Mar. 11, 2022, now U.S. Pat. No. 11,828,585, which is a continuation of U.S. patent application Ser. No. 16/817,552, filed on Mar. 12, 2020, now U.S. Pat. No. 11,307,024, which is a continuation of U.S. patent application Ser. No. 16/168,355, filed on Oct. 23, 2018, now U.S. Pat. No. 10,591,283, which is a continuation of U.S. patent application Ser. No. 15/913,253, filed on Mar. 6, 2018, now U.S. Pat. No. 10,209,061, which is a divisional of U.S. patent application Ser. No. 14/536,979, filed on Nov. 10, 2014, now U.S. Pat. No. 9,933,250, which is a continuation of U.S. patent application Ser. No. 12/867,416, 371 (c) Date: Feb. 18, 2011, now U.S. Pat. No. 8,885,150, which is a U.S. National Stage Entry of Int'l Application No. PCT/EP2009/001141, filed on Feb. 18, 2009, which claims priority from U.S. Provisional application 61/064,312, filed on Feb. 27, 2008, which are all incorporated herein in their entirety by reference.

BACKGROUND

Field of Invention

The present invention relates to methods of inspection usable, for example, in the manufacture of devices by lithographic techniques and to methods of manufacturing devices using lithographic techniques.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. This measurement may take place during the lithographic process, or separately from it, but is usually carried out using a separate metrology apparatus from the lithographic apparatus.

There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers direct a monochromatic radiation beam onto the substrate, the intensity of the scattered radiation being measured as a function of angle.

The scatterometer may be adapted to measure the overlay of targets in the form of two misaligned gratings or periodic structures by measuring asymmetry in the reflected spectrum and/or the detection configuration, the asymmetry being related to the extent of the overlay. In order to use smaller overlay targets, which may be positioned on the scribe lanes between products or on the product itself, it is known to use small measurement spots, that is the area of the incident radiation on the target. However, the use of such small measurement spots means that although the spots may fill small targets, averagely sized targets or large targets will be under-filled by the measurement spot such that for a grating imperfections in each grating line will affect the measured angle-resolved spectrum more strongly than in the case that all the grating lines contribute.

US 2002/0135783 discloses a method and apparatus for evaluating periodic structures formed on a sample in which a probe beam is continuously scanned over a wafer until sufficient data can be measured. However such an arrangement produces a lower signal to noise ratio than with a larger measurement spot.

U.S. Pat. No. 6,023,338 discloses a method of determining offset between adjacent layers of a semiconductor device in which a measurement spot scans across the gratings on a wafer.

SUMMARY

It is desirable to provide a scatterometer and a method for measuring a property of a substrate in which a smaller measurement spot may be used without reducing the signal to noise ratio achievable with a larger measurement spot.

According to an embodiment, a lithographic apparatus includes a scatterometer configured to measure a property of the substrate. The scatterometer includes a radiation source configured to produce a radiated spot on a target on the substrate, where the radiated spot includes positions on the target. The scatterometer further includes a detector configured to generate measurement signals that correspond to respective ones of the positions of the radiated spot and a processor configured to output, based on the measurement signals, a single value that is representative of the property of the substrate.

According to another embodiment, a lithographic cell includes a coater configured to coat a substrate with a radiation sensitive layer, a lithographic apparatus configured to expose images onto the radiation sensitive layer of the substrate, a developer configured to develop images exposed by the lithographic apparatus, and a scatterometer configured to measure a property of the substrate. The scatterometer includes a radiation source configured to produce a radiated spot on a target on the substrate, where the radiated spot includes positions on the target. The scatterometer further includes a detector configured to generate measurement signals that correspond to respective ones of the positions of the radiated spot and a processor configured to output, based on the measurement signals, a single value that is representative of the property of the substrate.

Yet in another embodiment, a device manufacturing method is provided. The method includes directing a radiated spot onto a target pattern formed on a substrate and moving the radiated spot along the target pattern in a series of discrete steps, where each discrete step corresponds to respective positions of the radiated spot on the target pattern. The method further includes generating measurement signals that correspond to respective ones of the positions of the radiated spot on the target pattern and determining, based on the measurement signals, a single value that is representative of the property of the substrate.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIG. 3 depicts a first scatterometer in accordance with an embodiment of the invention;

FIG. 4 depicts a second scatterometer in accordance with an embodiment of the invention;

DETAILED DESCRIPTION

Figure 1:
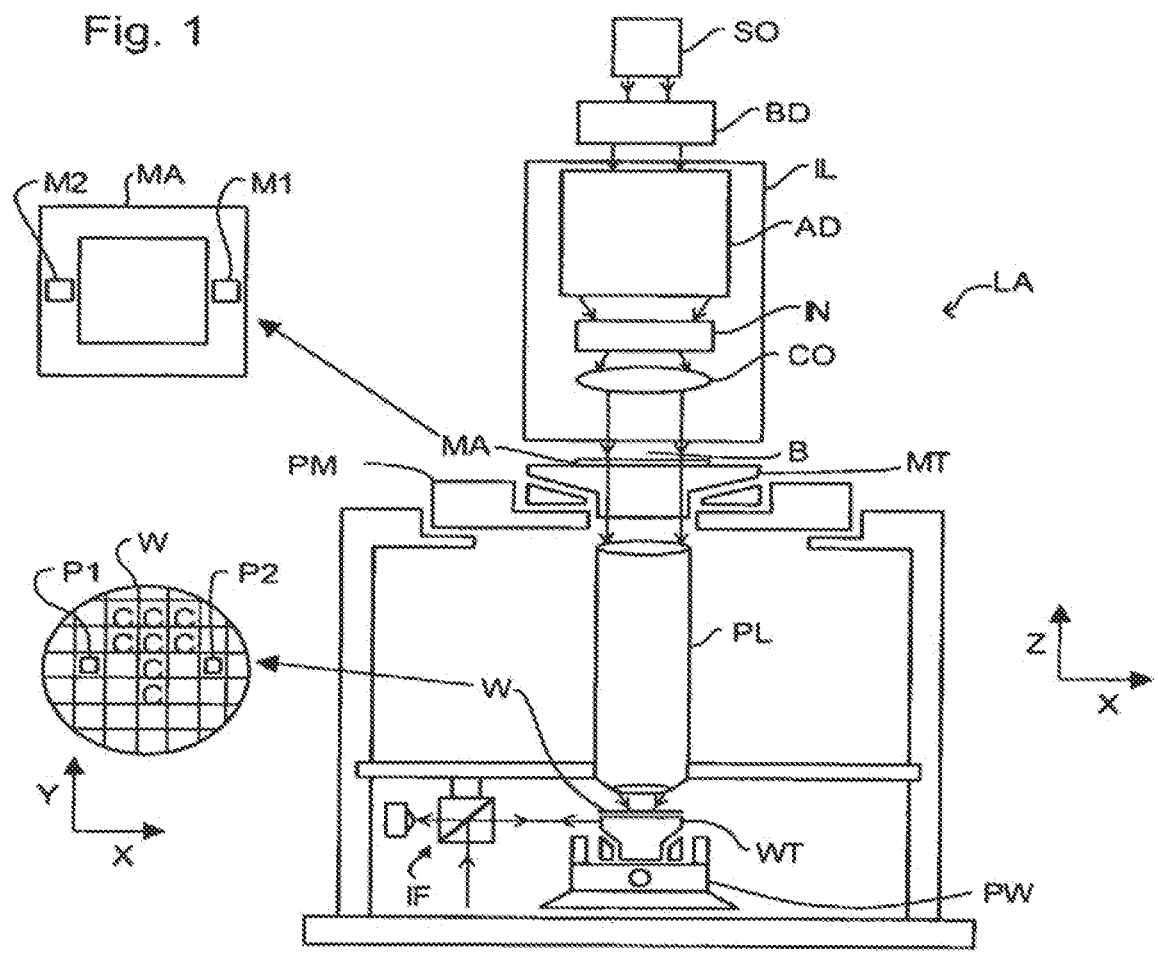
FIG. 1 depicts a lithographic apparatus in accordance with an embodiment of the invention.

FIG. 1 schematically depicts a lithographic apparatus LA. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables), hi such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. hi the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
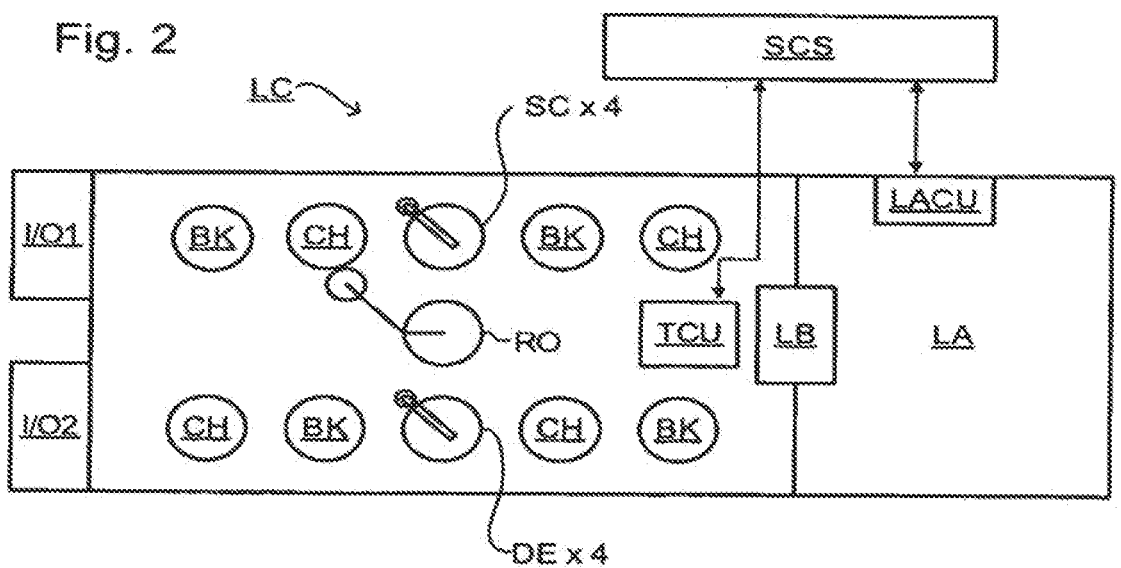
FIG. 2 depicts a lithographic cell or cluster in accordance with an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. The processing unit may be termed hereinafter as the "processor". In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer SM2 that may be used in an embodiment of the present invention is shown in FIG. 4. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of about 405-790 run or even lower, such as about 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least $2\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1,628, 164 A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Further details of a scatterometer which may be used in a scatterometer in accordance with the invention are described in U.S. Ser. No. 10/918,742, the contents of which are incorporated herein by reference.

Figure 5:
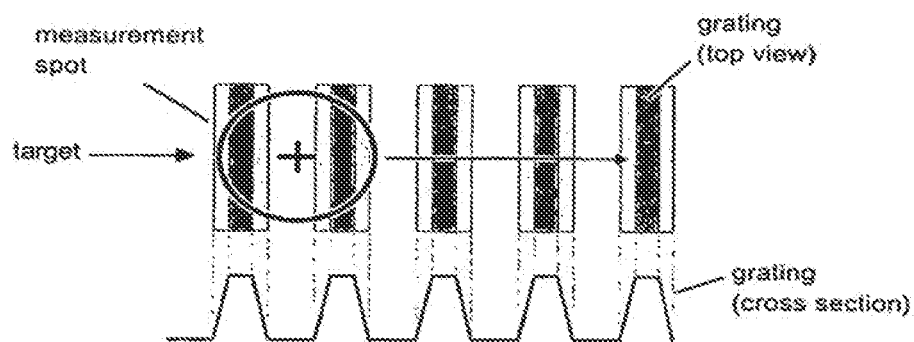
FIG. 5 illustrates a measurement spot incident on a grating.
Figure 6:
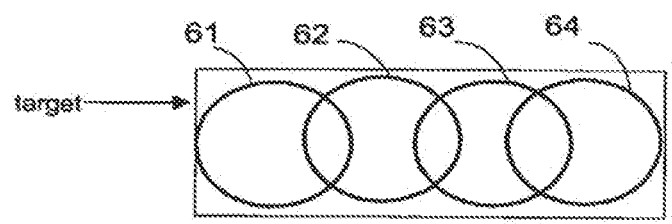
FIG. 6 illustrates the movement of the measurement spot over the grating in accordance with an embodiment of the invention.

Referring now also to FIGS. 5 and 6, in use of the scatterometer for the example of the target 30 being a grating on substrate W, in accordance with an embodiment of the invention the measurement spot on the grating only extends over a few periods of the grating. As indicated by spot positions 61, 62, 63, and 64 in FIG. 6 however, in accordance with an embodiment of the invention the position of the measurement spot is moved in discrete steps over the length of the target the spots having a portion overlap. The size of the radiation spot is smaller than the target in one direction along the target, the position of the radiation spot moving along the surface in the direction in a series of discrete steps. In FIG. 6, for the sake of clarity only four positions 61, 62, 63, 64 of the measurement spot are depicted. It will be appreciated however, that in practice there may be less, for example two, or considerably more than four spot positions, typically up to ten or even more. The detector 18 is arranged to measure the reflected light at each position of the spot together with, at each position of the measurement spot, a reference image produced by the reference beam split off by the beam splitter 16 and reflected back by the reference mirror 14. The measurements at each spot position are then added to produce a single signal from the target such that the parameters of the grating, such as line width and shape, may be used in the reconstruction process performed by the processing unit PU, using the parameters used to print the grating.

Figure 7:
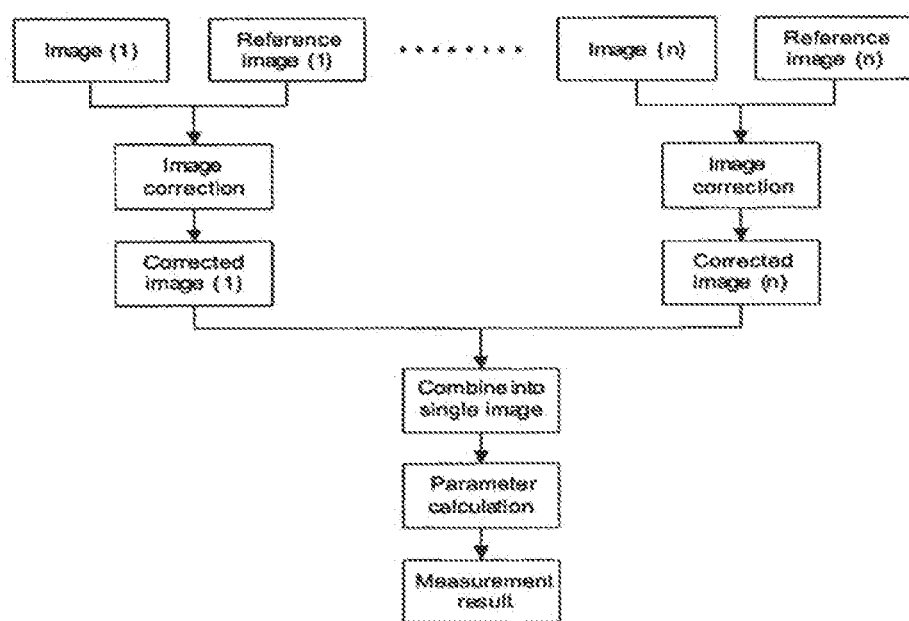
FIG. 7 illustrates a first data processing technique in accordance with an embodiment of the invention.

Turning now also to FIG. 7 in a first processing technique performed by the processing unit PU in a scatterometer in accordance with the invention data representing the images of the measured angle resolved spectra image (1), image (2) . . . image (n) produced from light reflected by each position of the measurement spot are combined to produce data representing a single image in order to perform the parameter calculations, and derive the required parameter.

Thus, in FIG. 7 in the top row of boxes data representing each image (1) . . . (n) are corrected, using data representing the corresponding reference images produced by the reference beam measured on detector 18 at each measurement spot position. This correction may consist of one or more of the DC level correction, ghost image correction of ghost images produced by spurious reflections for example, intensity level correction or illumination shape correction. It will be appreciated that in some cases this correction procedure may be omitted. The result is a set of corrected images (1) (n). These images are then combined into a single image by, for example, taking the average or mean value of all the images. Alternatively, the median for the images may be calculated. Parameter calculation is then performed, for example CD reconstruction, overlay calculation or focus dose calculation.

It will be appreciated that while on the conventional arrangement of measuring a grating with a small spot which measures the physical properties of a limited number of lines only, in a scatterometer in accordance with an embodiment the invention a better measurement of the average properties of the target can be obtained as information from more grating lines is combined. It will also be appreciated that by use of such a method compared to a method in which the spot is continuously scanned over the target, a higher signal to noise level can be produced as the signal is no longer limited by the signal to noise level of the detector due to the combination of the multiple images if each individual measurement uses a similar dynamic range as a single scanning measurement.

Figure 8:
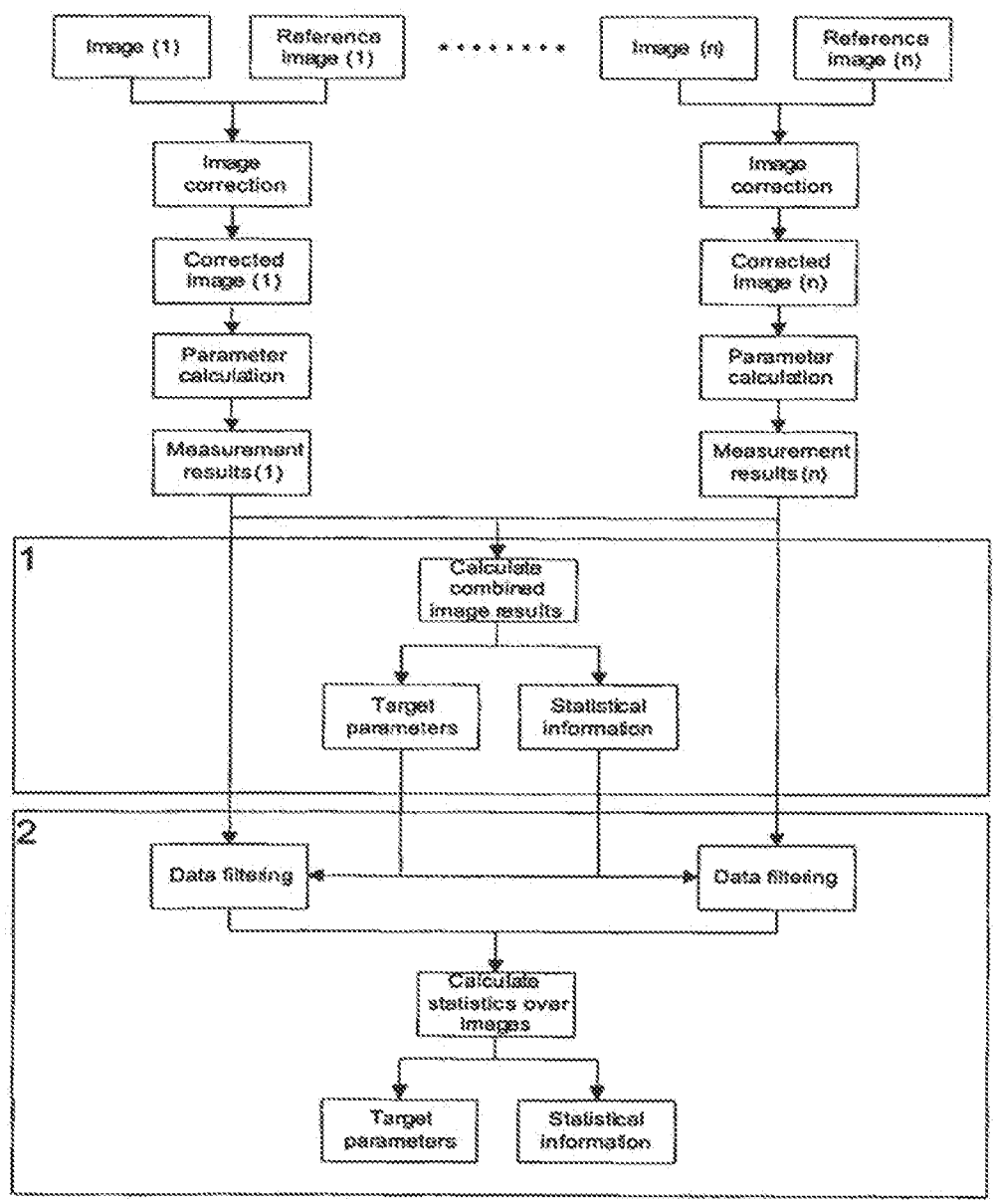
FIG. 8 illustrates a second data processing technique in accordance with an embodiment of the invention.

Turning now to FIG. 8 in an alternative processing technique performed by the processing unit or processor PU, the parameters are calculated for each individual image at each measurement position, the results then being combined and used as a basis of the further processing.

Thus, referring to the upper-most boxes in FIG. 8 as in the process described in relation to FIG. 7, each image (1) (n) is corrected based on the corresponding reference image (1) (n), to provide a corrected image (1) (n). As before this procedure may not be necessary in some circumstances. Parameter calculation for each corrected image (1) (n) is then performed separately.

A statistical analysis of the set of results of the images is then performed as indicated in the large box marked 1 in FIG. 8, to obtain the target parameter values including the mean or average and median values. The variation parameters can then also be determined such as variance, the standard deviation, the minimum and maximum values confidence level, the mode and outlier identification.

Optional processing may then be performed as indicated in the large box marked 2 in FIG. 8, in particular data filtering to remove data points outside preset limits. Statistics may then be calculated from the set of data defining the images, to produce revised target parameters based on the statistical information.

It will be appreciated that in this second process the variance of the measurement results produced by the statistical processing can be used to determine the spread in the measurement parameter over the target or the stability of the parameter determination can be determined from the measurement data. In either case an indication of the reliability and stability of the measurement is produced. Furthermore, flyer removal allows reduction of the uncertainty of the measurement value.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments are disclosed in the subsequent numbered clauses:

1. A scatterometer configured to measure a property of a substrate, comprising
   a radiation source configured to provide a radiation beam to produce a radiation spot on a target on a surface of the substrate, the size of the radiation spot being smaller than the target in one direction along the target, the position of the radiation spot moving along the surface in the direction in a series of discrete steps;

a detector configured to detect a spectrum of the radiation beam reflected from the target on the surface of the substrate and to produce a measurement signal representative of the spectrum at each position of the radiation spot along the direction; and a processor configured to process the measurement signals produced by the detector corresponding to each position of the radiation spot to derive a single value for the property.

2. A scatterometer according to clause 1, wherein the processor is configured to correct each measurement signal using a respective reference signal corresponding to the position of the radiation spot on the target.

3. A scatterometer according to clause 2, wherein the detector is configured to measure each reference signal.

4. A scatterometer according to clause 1, wherein the processor is configured to combine signals representative of each of the measurement signals to produce a combined signal and to use the combined signal to derive the single value for the property.

5. A scatterometer according to clause 4, wherein the signals are combined by taking the average value of the measurement signals.

6. A scatterometer according to clause 4, wherein the signals are combined by taking the median value of the measurement signals.

7. A scatterometer according to clause 1, wherein the processor is configured to derive a plurality of values for the property from each signal indicative of each measurement signal and to combine the plurality of values to produce the derived single value for the property.

8. A scatterometer according to clause 7, wherein the processor is configured to use the plurality of values to produce statistical information relating to the derived single value.

9. A scatterometer according to clause 8, wherein the statistical information comprises the variance, or the standard deviation, or the minimum and maximum values, or the confidence level, or the mode and outlier identification, or any combination of the preceding.

10. A scatterometer according to clause 8, wherein the processor is configured to use the statistical information to redefine a target parameter for the value of the property.

11. A scatterometer according to any one of the preceding clauses, wherein the target is a grating structure formed on the surface of the substrate, and the measurement signals produced by the detector are processed to produce a single value derived from a plurality of lines of the grating structure.

12. A scatterometer according to any one of the preceding clauses, wherein the detector is configured to detect an angle resolved spectrum of the radiation beam reflected at a plurality of angles from the target.

13. A method of measuring a property of a substrate, comprising providing a radiation beam to produce a radiation spot on a target on a surface of the substrate, the size of the radiation spot being smaller than the target in one direction along the target;

moving the position of the radiation spot along the target in the direction in a series of discrete steps;

detecting a spectrum of the radiation beam reflected from each position of the radiation spot along the direction and producing a measurement signal representative of the spectrum at each position of the radiation spot; and processing the measurement signals corresponding to each position of the radiation spot to derive a single value for the property.

14. A method according to clause 13, comprising correcting each measurement signal using a respective reference signal corresponding to the position of the radiation spot on the target.

15. A method according to clause 14, wherein each reference signal is measured by the same detector as that used to measure the measurement signals.

16. A method according to clause 13, wherein the processing includes combining signals representative of each of the measurement signals to produce a combined signal, the combined signal being used to derive the single value for the property.

17. A method according to clause 16, wherein the signals are combined by taking the average value of the measurement signals.

18. A method according to clause 16, wherein the signals are combined by taking the median value of the measurement signals.

19. A method according to clause 13, wherein a plurality of values for the property is derived from each signal indicative of each measurement signal and combined to produce the derived single value for the property.

20. A method according to clause 19, wherein the plurality of values is used to produce statistical information relating to the derived single value.

21. A method according to clause 20, wherein the statistical information comprises the variance, or the standard deviation, or the minimum and maximum values, or the confidence level, or the mode and outlier identification or any combination of the preceding.

22. A method according to clause 20, wherein the statistical information is used to redefine a target parameter for the value of the property.

23. A method according to any one of clauses 13 to 22, wherein a grating structure is formed on the surface of the substrate, and the measurement signals produced by the detector are processed to produce a single value derived from a plurality of lines of the grating structure.

24. A method according to any one of clauses 13 to 23, wherein the detecting includes detecting an angle resolved spectrum of the radiation beam reflected at a plurality of angles from the target.

25. A lithographic apparatus comprising:

an illumination optical system arranged to illuminate a pattern;

a projection optical system arranged to project an image of the pattern on to a substrate; and a scatterometer configured to measure a property of the substrate, the scatterometer comprising:

a radiation source configured to provide a radiation beam to produce a radiation spot on a target on a surface of the substrate, the size of the radiation spot being smaller than the target in one direction along the target, the position of the radiation spot moving along the surface in the direction in a series of discrete steps;

a detector configured to detect a spectrum of the radiation beam reflected from the target on the surface of the substrate and to produce a measurement signal representative of the spectrum at each position of the radiation spot along the direction; and a processor configured to process the measurement signals produced by the detector corresponding to each position of the radiation spot to derive a single value for the property.

26. A lithographic cell comprising:
   a coater arranged to coat substrates with a radiation sensitive layer;
   a lithographic apparatus arranged to expose images onto the radiation sensitive layer of substrates coated by the coater;
   a developer arranged to develop images exposed by the lithographic apparatus;
   and a scatterometer configured to measure a property of a substrate, the scatterometer comprising
   a radiation source configured to provide a radiation beam to produce a radiation spot on a target on a surface of the substrate, the size of the radiation spot being smaller than the target in one direction along the target, the position of the radiation spot moving along the surface in the direction in a series of discrete steps;
   a detector configured to detect a spectrum of the radiation beam reflected from a target on the surface of the substrate and to produce a measurement signal representative of the spectrum at each position of the radiation spot along the direction; and
   a processor configured to process the measurement signals produced by the detector corresponding to each position of the radiation spot to derive a single value for the property.

27. A device manufacturing method comprising:
   using a lithographic apparatus to form a pattern on a substrate; and
   determining a value related to a parameter of the pattern by:
   providing a radiation beam to produce a radiation spot on the target, the size of the radiation spot being smaller than the target in one direction along the target;
   moving the position of the radiation spot along the target in the direction in a series of discrete steps;
   detecting a spectrum of the radiation beam reflected from each position of the radiation spot along the direction and producing a measurement signal representative of the spectrum at each position of the radiation spot; and
   processing the measurement signals corresponding to each position of the radiation spot to derive a single value for the property.

28. A scatterometer configured to measure a property of a target on a substrate, the scatterometer comprising:
   a radiation source configured to produce a radiated spot on the target, wherein the radiated spot is moved between discrete positions along a length of the target;
   a detector configured to generate measurement signals that correspond to respective ones of the positions of the radiated spot; and
   a processor configured to output, based on the measurement signals, a single value that is representative of the property of the target.

29. The scatterometer of clause 28, wherein the radiated spot is smaller than the target in a dimension along the length of the target.

30. The scatterometer of clause 28, wherein the processor is configured to:
   correct the measurement signals using respective reference signals that correspond to the respective positions of the radiated spot on the target; and
   derive, based on the corrected measurement signals, the single value.

31. The scatterometer of clause 30, wherein the detector is further configured to measure each of the respective reference signals.

32. The scatterometer of clause 31, wherein the detector is configured to measure the measurement signals and the respective reference signals simultaneously.

33. The scatterometer of clause 28, wherein the processor is configured to:
   correct the measurement signals using respective reference signals that correspond to the respective positions of the radiated spot on the target;
   derive values representative of the property of the target at the respective positions on the target, the values being derived based on respective ones of the corrected measurement signals; and
   derive, based on the values, the single value.

34. The scatterometer of clause 33, wherein the processor is further configured to use the derived values representative of the property of the target at the respective positions on the target to produce statistical information relating to the derived single value, wherein the statistical information comprises a variance, a standard deviation, minimum and maximum values, a confidence level, or a mode and outlier identification.

35. The scatterometer of clause 34, wherein the processor is configured to use the statistical information to redefine a target parameter for the derived single value of the property.

36. The scatterometer of clause 28, wherein the processor is configured to:
   combine the measurement signals to output a combined signal; and
   derive, based on the combined signal, the single value.

37. The scatterometer of clause 28, wherein the processor is configured to:
   determine an average value of the measurement signals; and
   derive, based on the average value, the single value.

38. The scatterometer of clause 28, wherein the processor is configured to:
   determine a median value of the measurement signals; and
   derive, based on the median value, the single value.

39. The scatterometer of clause 28, wherein the target comprises a grating structure on the surface of the substrate, and the measurement signals correspond to lines of the grating structure.

40. The scatterometer of clause 28, wherein the detector is configured to detect an angle resolved spectrum of the radiated spot reflected at a plurality of angles from the target.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A system comprising:
    a means for producing a radiated spot on a target on a substrate;
    a means for adjusting a position of the radiated spot along a first direction across the target and along a second direction that is at an angle with respect to the first direction, wherein the first and second directions are defined along a surface of the substrate;
    a means for receiving radiation scattered from multiple locations of the target according to the adjusting the position of the radiated spot, wherein the multiple locations are defined along the surface of the substrate;
    a means for generating measurement signals corresponding to the multiple locations of the target irradiated by the radiation spot;
    a means for receiving the measurement signals;
    a means for aggregating the measurement signals; and
    a means for deriving a single value that is representative of a property of the target based on irradiation of the multiple locations of the target and the aggregating the measurement signals.

2. The system of claim 1, wherein:
    the first direction defines an X axis; and
    the second direction comprises a directional component along the X axis and a directional component along a Y axis that is orthogonal to the X axis.

3. The system of claim 1, wherein the radiated spot is smaller than the target in a dimension along the length of the target.

4. The system of claim 1, wherein the means for deriving comprises:
    a means for correcting the measurement signals using respective reference signals that correspond to respective ones of the multiple locations of the target, wherein the deriving is further based on the corrected measurement signals.

5. The system of claim 4, wherein the means for deriving comprises:
    a means for determining values representative of the property of the target at the respective ones of the multiple locations of the target, the values being determined based on respective ones of the corrected measurement signals, wherein the deriving is further based on the values.

6. The system of claim 5, wherein the means for deriving comprises:
    a means for producing statistical information relating to the derived single value using the derived values representative of the property of the target at the respective ones of the multiple locations of the target, wherein the statistical information comprises a variance, a standard deviation, minimum and maximum values, a confidence level, or a mode and outlier identification.

7. The system of claim 6, wherein the means for deriving comprises:
    a means for redefining a target parameter for the derived single value of the property using the statistical information.

8. The system of claim 1, wherein the means for deriving comprises:
    a means for determining an average value of the measurement signals, wherein the deriving is further based on the average value.

9. The system of claim 1, wherein the means for deriving comprises:
    a means for determining a median value of the measurement signals, wherein the deriving is further based on the median value.

10. The system of claim 1, wherein:
    the target comprises a grating structure; and
    the measurement signals are based on lines of the grating structure.

11. The system of claim 10, wherein the first direction is parallel to a direction of a width of the lines.

12. The system of claim 1, wherein the means for receiving comprises:
    a means for detecting an angle resolved spectrum of the radiated spot reflected at a plurality of angles from the target.

13. The system of claim 1, wherein the means for adjusting comprises:
    a means for performing the adjusting such that illuminated portions of the target, corresponding to respective ones of the multiple locations of the target, overlap.

14. The system of claim 1, wherein the received radiation is associated with a portion of the multiple locations of the target that is along the first direction.

15. The system of claim 1, wherein the received radiation is associated with a portion of the multiple locations of the target that is along the second direction.

16. The system of claim 1, wherein:
    the means for adjusting comprises a means for performing an iteration of the adjusting the position of the radiated spot along the first direction;
    the received radiation is further associated with positions of the radiated spot of the iteration; and
    the measurement signals are further based on the positions of the radiated spot of the iteration.

17. The system of claim 16, wherein the means for performing the iteration comprises:
    a means for performing the iteration such that illuminated portions of the target, corresponding to respective ones of positions of the radiated spot on the target along at least the first direction and the positions of the radiated spot of the iteration, partially overlap.

18. The system of claim 16, wherein an adjustment of the radiated spot during the iteration is anti-parallel to the first direction.

* * * * *

UNITED STATES PATENT AND TRADEMARK OFFICE
CERTIFICATE OF CORRECTION

| | | |
|---|---|---|
| PATENT NO. | : 12,235,096 B2 | Page 1 of 1 |
| APPLICATION NO. | : 18/486811 | |
| DATED | : February 25, 2025 | |
| INVENTOR(S) | : Pellemans et al. | |

It is certified that error appears in the above-identified patent and that said Letters Patent is hereby corrected as shown below:

In the Specification

In Column 9, Lines 35-36, delete "(1) (n)." and replace with --(1) … (n).--;

In Column 9, Line 62, delete "(1) (n)" and replace with --(1) … (n)--;

In Column 9, Lines 63-64, delete "(1) (n)," and replace with --(1) … (n),--;

In Column 9, Line 64, delete "(1) (n)." and replace with --(1) … (n).--;

In Column 9, Line 66, delete "(1) (n)" replace with --(1) … (n)--.

Signed and Sealed this
First Day of April, 2025

Coke Morgan Stewart
*Acting Director of the United States Patent and Trademark Office*